United States Patent [19]

Patalong

[11] Patent Number: 4,613,766
[45] Date of Patent: Sep. 23, 1986

[54] THYRISTOR HAVING CONTROLLABLE EMITTER SHORT CIRCUITS

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 199,633

[22] Filed: Oct. 22, 1980

[30] Foreign Application Priority Data

Nov. 9, 1979 [DE] Fed. Rep. of Germany ....... 2945366

[51] Int. Cl.⁴ .......................................... H03K 17/60
[52] U.S. Cl. ............................... 307/252 A; 357/23.4; 357/38; 357/86; 357/23.12; 307/252 C
[58] Field of Search ............... 357/23.4, 38, 86, 23.12; 307/252 A, 252 C

[56] References Cited

U.S. PATENT DOCUMENTS

| | | | |
|---|---|---|---|
| 3,360,696 | 12/1967 | Neilson et al. ........................ | 357/39 |
| 3,742,318 | 11/1971 | Yamashita ............................. | 357/38 |
| 3,753,055 | 8/1973 | Yamashita et al. ................... | 357/38 |
| 3,831,187 | 8/1974 | Neilson .................................. | 357/38 |
| 3,858,235 | 12/1974 | Schild .................................... | 357/38 |
| 3,891,866 | 6/1975 | Okuhara et al. ................ | 307/252 A |
| 3,896,476 | 7/1975 | Kawakami ............................. | 357/38 |
| 4,016,592 | 4/1977 | Yatsuo et al. ......................... | 357/38 |
| 4,087,834 | 5/1978 | Temple ................................... | 357/38 |
| 4,092,703 | 5/1978 | Sueoka et al. ......................... | 357/86 |
| 4,142,201 | 2/1979 | Sittig et al. ............................ | 357/38 |
| 4,199,774 | 4/1980 | Plummer ................................. | 357/23 |
| 4,219,833 | 8/1980 | Temple ................................... | 357/38 |
| 4,224,634 | 9/1980 | Svedberg ............................... | 357/38 |
| 4,243,998 | 1/1981 | Schlangenotto et al. ............. | 357/38 |
| 4,244,000 | 1/1981 | Ueda et al. ............................ | 357/38 |
| 4,301,462 | 11/1981 | Lowry .................................... | 357/38 |
| 4,331,884 | 5/1982 | Svedberg ............................... | 357/38 |

FOREIGN PATENT DOCUMENTS 2040657 2/1972 Fed. Rep. of Germany ........ 357/38
2149760 4/1972 Fed. Rep. of Germany ........ 357/38
52-35586 3/1977 Japan ..................................... 357/38

OTHER PUBLICATIONS

B. Baliga, "Enhanc. and Dept. Vert. Chan. MOS Gated Thyrs.", Electr. Lett., Sep. 27, 1979, vol. 15, #20, pp. 645-647.
J. Plummer et al., "Insulated-Gate Planar Thyrs. I & II", IEEE Trans. on Elec. Dev., vol. ed-27, #3, Feb. 1980, pp. 380-394.

*Primary Examiner*—Joseph E. Clawson, Jr.
*Attorney, Agent, or Firm*—Hill, Van Santen, Steadman & Simpson

[57] ABSTRACT

A thyristor has a semiconductor body which includes first and second base layers contacting one another, an n-emitter layer contacting the first base layer, a first electrode on the n-emitter layer, a p-emitter layer contacting the second base layer, a second electrode on the p-emitter layer, and controllable metal insulator-semiconductor emitter short circuit structures located at at least one boundary surface of the semiconductor body. Each of the short circuit structures includes first and second semiconductor regions of a first conductivity type, the first region contacting the first electrode, and an intermediate third semiconductor region of a second opposite conductivity type between the first and second regions and extending to the boundary surface. An insulated gate is carried over the third region. An emitter layer associated with the metal-insulator-semiconductor structures is divided into a plurality of emitter zones which are respectively provided with portions of the electrode contacting said emitter layer, and the metal-insulator-semiconductor structures are located at the edges of the emitter zones. A common terminal is connected to the insulated gates for receiving a voltage pulse to neutralize the short circuits.

6 Claims, 3 Drawing Figures

THYRISTOR HAVING CONTROLLABLE EMITTER SHORT CIRCUITS

BACKGROUND OF THE INVENTION

1. Field of the Invention

The present invention relates to a thyristor having controllable emitter short circuits, and more particularly to a thyristor having a semiconductor body containing an exterior n-emitter layer provided with a cathode, an exterior p-emitter layer provided with an anode and two base layers respectively adjacent to the emitter layers, and having controllable emitter short circuits designed as metal-insulator-semiconductor structures arranged at a boundary surface of a semiconductor body, the controllable emitter short circuits comprising a respective first semiconductor region of a first conductivity type connected to the cathode, a respective semiconductor region of the first conductivity type connected to a base layer and an intermediate layer of a second conductivity type positioned between the latter regions which is covered by a gate electrically insulated with respect to the semiconductor body.

2. Description of the Prior Art

Thyristors of the type generally set forth above are known from U.S. Pat. No. 3,243,669. Upon the application of a control voltage to the gate of such a MIS structure, a short circuit path is activated which bridges the pn junction between the emitter layer connected to the cathode and the adjacent base layer. This results in a transfer of the thyristor from the current-conducting state into the block state in which practically no current flows between the cathode and the anode despite the voltage adjacent in the forward conducting direction. The change from the blocked state into the current-conductive state occurs by applying a further control voltage to the gate of a further MIS structure which bridges the pn junction between the two base layers in a low resistance manner.

On the other hand, a thyristor having a short circuit emitter is known from the German allowed application 24 38 894 in which an exterior emitter zone is penetrated by a plurality of short circuit zones to be interpreted as portions of the adjacent base layer, the short circuit zones extending up to the boundary surface of the thyristor body and being connected in the boundary surface to the cathode. Thereby, it is disadvantageous that several short circuit zones must be provided in order to achieve a good stability of the thyristor, i.e. a high security against unintentional triggering operations upon occurrence of voltages at the anode-cathode path poled in the forward conducting direction which partially increase very quickly (high dU/dt load). However, the triggering behavior is greatly influenced by a large plurality of short circuit zones. The trigger current required becomes large. The triggered surface of the thyristor spreads very slowly in the lateral direction over the entire cross section. As a result, significant turn-on losses occur.

SUMMARY OF THE INVENTION

The object of the present invention is to improve a thyristor which is provided with emitter short circuits in order to achieve a good stability with respect to its turn-on behavior.

According to the present invention the above object is achieved, in a thyristor of the type generally mentioned above in that the n-emitter layer (p-emitter layer) is subdivided into a plurality of emitter zones which are respectively provided with portions of the cathode (anode) conductively connected amongst one another, in that a plurality of strip-shaped MIS structures are respectively arranged at the edge with respect to the emitter zones, and in that the gates of the MIS structures can be wired by way of a control voltage terminal to a voltage pulse neutralizing the emitter short circuits.

The advantage attainable in practicing the present invention lies, in particular, in that, in comparison to known thyristors having short circuit zones, both a better stability and a better triggering behavior in view of a rapid, controlled triggering over the entire thyristor cross section are achieved, although those are mutually contradictory requirements in thyristors having short circuit zones. On the other hand, the control of the triggering operation is significantly simpler than in the known thyristor having MIS short circuit paths, since a control of the pn junction between the two base layers is eliminated.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
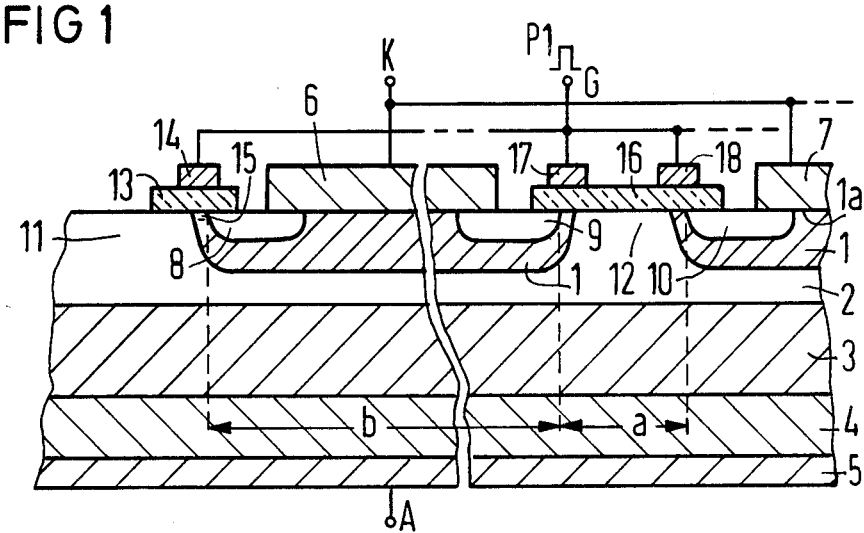
FIG. 1 is a cross sectional view of a first exemplary embodiment of the invention.
Figure 2:
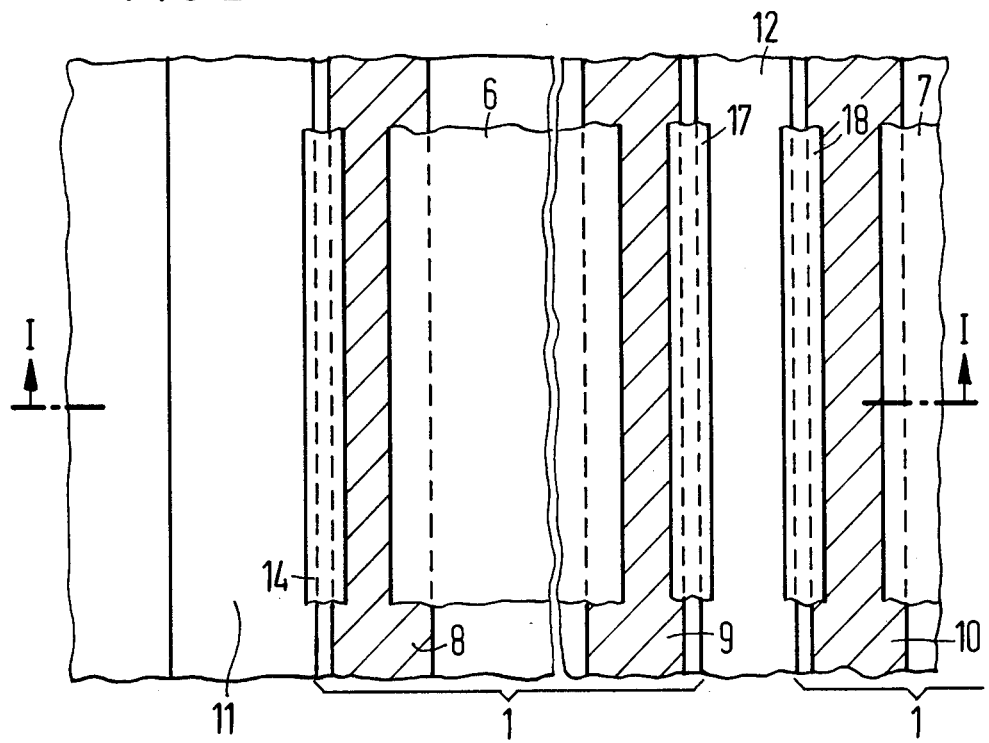
FIG. 2 is a plan view of the arrangement illustrated in FIG. 1.

The thyristor illustrated in FIGS. 1 and 2 comprises a semiconductor body having semiconductor layers 1–4 of alternating conductivity types which consists, for example, of doped silicon. The exterior n-conductive layer 1 is referenced the n-emitter layer and the exterior p-conductive layer 4 is referenced as the p-emitter layer. The p-conductive layer 2 and the n-conductive layer 3 represent the so-called base layers. The p-emitter layer 4 is provided with an anode 5 which has an anode connection A, whereas the n-emitter layer 1 is subdivided into a plurality of strip-shaped emitter zones of which only two are illustrated. These can be seen in FIG. 2 as vertical, parallel strips. Each of these emitter zones 1 is provided with a portion 6, 7 of the cathode, whereby the individual parts of the cathode are conductively connected amongst one another and are extended to a common cathode terminal K.

In FIG. 1, which shows a cross section along the line I—I of FIG. 1, p-conductive semiconductor regions 8–10 are illustrated which are inserted in the n-emitter zone 1 in such a manner that they extend up to the boundary surface 1a of the semiconductor body. In FIG. 2, the surfaces of the semiconductor regions are illustrated with hatching for the purpose of a better overview. The regions 8–10 are respectively contacted at their edges by the portions 6, 7 of the cathode. Individual zones 11 and 12 of the base layer 2 extend up to the boundary surface 1a and separate the strip-shaped emitter zones 1 from one another. The region 8 forms a first p-region; the region 11 forms a second p-region and the intervening portion of the left-hand n-emitter zone 1 forms a n-intermediate layer. A thin, electrically insulating layer 13 comprising, for example, SiO$_2$ is provided on the boundary surface 1a, a gate 14 being arranged on the electrically insulating layer 13 in such a manner that it covers the n-intermediate layer. The portions 8, 1, 11, 13 and 14 form a MIS structure. If it belongs to the depletion type, then, without the influence of the voltage on the gate 14, a p-conductive inversion channel 15 exists at the boundary surface 1a between the regions 8 and 11, the p-conductive inversion channel 15 conductively connecting the regions 8 and 11 to one another. If one applies positive control voltage to a control voltage terminal G of the gate 14, then the inversion channel is eliminated. If the MIS structure is of the enhancement type, then, given a voltage-less gate, no inversion channel 15 exists. This is only constructed by means of the application of a negative control voltage 2G by means of inversion of the emitter zone 1 beneath the gate 14.

The inversion channel 15, therefore, represents a controllable emitter short circuit which either connects or does not connect the base layer 2 to the region 8 and, therefore, to the cathode as a function of a control voltage applied at the terminal G, the connection being a low-resistance connection.

In an analogous manner, MIS structures 9, 12, 16 and 17 derive at the right edge of the left n-emitter zone 1 and MIS structures 10, 12, 16 and 18 derive at the left edge of the right n-emitter zone by means of the arrangement of an electrically insulating layer 16 comprising, for example, SiO$_2$ on which two gates 17 and 18 likewise connected to the terminal G are provided. In FIG. 1, therefore, a total of three controllable emitter short circuits are arranged edge-wise with respect to the emitter zone. In that portion of the thyristor no longer illustrated which extends toward the right of FIG. 1, however, further n-emitter zones are present which are respectively provided with one or two edge-wise emitter short circuits. All of these emitter short circuits advantageously lie at the control voltage terminal G, whereas the portions of the cathode, for example the portions 6 and 7, which respectively contact n-emitter zones are conductively connected amongst one another and are connected to the cathode terminal K.

Given MIS structures of the depletion type, the emitter short circuits are respectively activated given a voltage-free terminal G. Thereby, the thyristor is in its blocked condition in which, despite a voltage poled in the forward conducting direction at the terminals N, K, practically no current flows between these terminals. The thermally generated hole electrons are diverted from the base layer 2 to the cathode, so that no charge carriers are injected into the base layer 2 from the n-emitter zones 1. It is advantageous for a stable behavior of the thyristor that the controllable emitter circuits occupy approximately 0.01%–3% of the thyristor surface which, given the precondition of a uniform distribution of the emitter zones 1 over the boundary surface 1a, can be explained in such a manner that the paths a and b indicated in FIG. 1 have an approximate ratio to one another of 1:10,000–3:100. For example, values from 2–3 $\mu$m come into consideration for the length of an inversion channel 15. If one supplies a positive voltage P1 to the terminal G, then the emitter short circuits are only switched off for the duration P1 and the triggering of the thyristor occurs. Subsequently, a load current of a load circuit connected at the terminal K flows over the thyristor switch in a low-resistance manner. The shut-down of the thyristor is achieved by shutting off the voltage applied between the terminals AK in the forward conducting direction or, in the case of an alternating voltage, by the next successive zero pause or crossing.

In some cases of application, it can be desirable to employ MIS structures of the enhancement type. Thereby, the terminal G always lies at a negative bias voltage which, for the purpose of triggering, is neutralized or overcompensated by the positive pulse P1 so that, during the triggering operation, no voltage occurs at the terminal G or, in the case of over-compensation, a positive pulse appears at the terminal G.

Instead of the n-emitter layer 1, the p-emitter layer 4 can be subdivided into individual emitter zones which are overlaid with individual portions of the anode connected amongst one another. In this case, controllable p-emitter short circuits are provided. FIGS. 1 and 2 can be employed for illustrating this variation when the reference symbols of the terminals A and K are mutually interchanged and the semiconductor portions 1–4 and 8–10 respectively exhibit opposite conductivities to those previously described. The voltage pulse P1 then has a negative operational sign. It is a matter of MIS structures of the enhancement type, then a positive bias voltage is to be supplied to the terminal G, the positive bias voltage then being briefly compensated by means of a negative pulse P1.

Figure 3:
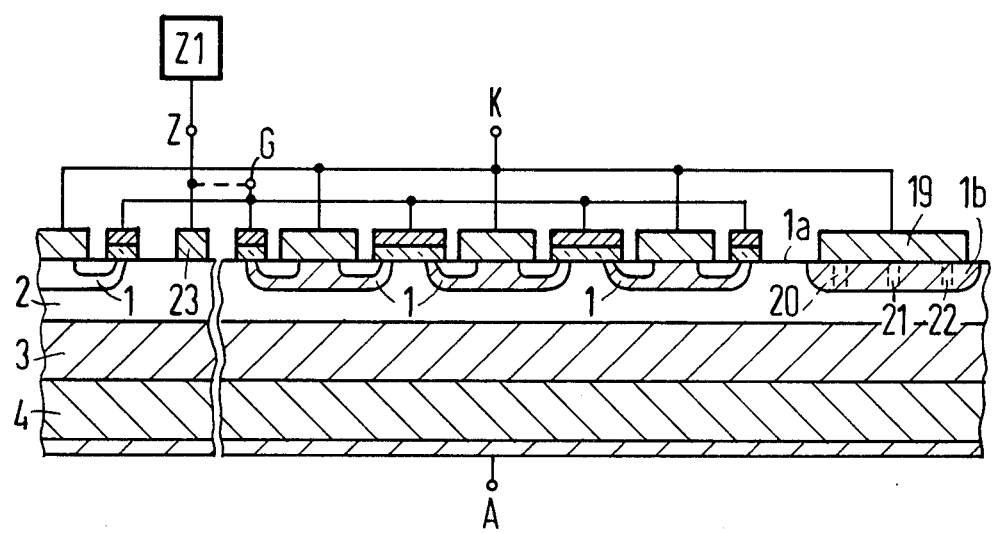
FIG. 3 is a cross sectional view of a second exemplary embodiment of the invention.

FIG. 3 illustrates a second exemplary embodiment of the invention in which, in addition to the n-emitter zones 1 already described, a further n-emitter zone 1b is provided which is contacted by a further portion 19 of the cathode. It is penetrated by a plurality of zones 20–22 of the base layer 2 which extend up to the boundary surface 1a and are likewise contacted by the portion 19 in the boundary surface 1a. The zones 20–22 therefore form fixed n-emitter short circuits. In the thyristor according to FIG. 3 which, because of the emitter zone 1b, governs greater load currents than the embodiment illustrated in FIG. 1, the fixed emitter short circuits 20–22 prevent a decrease of the stability.

As can be seen from FIG. 3, a trigger electrode 23 can be provided on a portion of the base layer 2, the trigger electrode exhibiting a terminal Z for a trigger circuit Z1. According to a further development of the invention, the control voltage terminal G can also be connected to the terminal Z, as is indicated by a broken line. In this case, a trigger voltage pulse at the terminal Z is employed as the pulse P1.

As indicated in FIG. 2, the emitter zones 1 can extend in a straight line over the entire thyristor surface, whereby a trigger electrode 23 which may be present under certain conditions is likewise advantageously designed as a strip. On the other hand, the emitter zones 1 can also be designed as concentric rings, whereby a trigger electrode 23 is advantageously arranged in the center of such emitter zones. Further n-emitter zones 1b will then likewise be arranged in rings.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method of operating a thyristor structure of the type in which a semiconductor body includes first and second base layers adjacent and contacting one another, an n-emitter layer contacting the first base layer, a first electrode contacting the n-emitter layer, a p-emitter layer contacting the second base layer, a second electrode contacting the p-emitter layer, and controllable metal-insulator- semiconductor emitter short circuit structures located at at least one boundary surface of the semiconductor body, each of the short circuit structures including a p semiconductor region of the first conductivity type contacting the first electrode, a second semiconductor region of the p conductivity type contacting the adjacent base layer, an intermediate third semiconductor region of the n, opposite conductivity type between said first and second regions adjacent the boundary surface, and an insulated gate carried over the intermediate third region, in which the emitter layer associated with the metal-insulator-semiconductor structures is divided into a plurality of emitter zones including edges, (*) said emitter zones being respectively provided with portions of the electrode contacting said emitter layer, said portions being conductively connected with one another, the metal-insulator-semiconductor structures, including the insulated gates, are located at the emitter zone edges, and a common terminal is connected to the gates for receiving a voltage pulse to neutralize the emitter short circuits, comprising the steps of:

applying a voltage pulse to the common terminal of a polarity which causes a transfer of the thyristor from the blocked state into the conducting state for depletion type metal-insulator-semiconductor structures.

2. The method of claim 1, wherein a trigger electrode is provided on the base layer adjacent the emitter layer having the short circuit paths, and a trigger terminal connected to said trigger electrode for receiving a trigger signal and further comprising the step of:

applying a trigger voltage pulse concurrently to the common terminal and the trigger electrode.

3. In a thyristor structure of the type in which a semiconductor body includes first and second base layers adjacent and contacting one another, an n-emitter layer contacting the first base layer, a first electrode contacting the n-emitter layer, a p-emitter layer contacting the second base layer, a second electrode contacting the p-emitter layer, and controllable metal-insulator-semiconductor emitter short circuit structures located at at least one boundary surface of the semiconductor body, each of the short circuit structures including a first semiconductor region of a first conductivity type contacting the first electrode, a second semiconductor region of the first conductivity type contacting the adjacent the base layer, an intermediate third semiconductor region of a second opposite conductivity type between the first and second regions adjacent the boundary surface, and an insulated gate carried over the intermediate third region, the improvement wherein:

the emitter layer associated with the metal-insulator-semiconductor structures is divided into a plurality of emitter zones including edges, said emitter zones being respectively provided with portions of the electrode contacting said emitter layer, said portions being conductively connected with one another;

the metal-insulator-semiconductor structures, including the insulated gates, are located at the emitter zone edges;

a common terminal is connected to the gates for receiving a voltage pulse to neutralize the emitter short circuits;

each of the first regions is located within the respective emitter zone adjacent a zone edge and extending to the boundary surface of the semiconductor body;

each of the second regions comprises a portion of the adjacent base layer and extends up to the boundary surface; and each of the intermediate third regions are portions of the respective emitter layer and extend up to the boundary surface.

4. The improved thyristor structure of claim 3, wherein:

a further emitter zone is located in the respective base layer and extends up to the boundary surface; a further electrode portion contacts said further emitter zone; and portions of the respective base layer extend through said further emitter zone and contact said further electrode portion.

5. The improved thyristor structure of claim 3, wherein:

a trigger electrode is provided on the base layer adjacent the emitter layer having the short circuit paths; and a trigger terminal connected to said trigger electrode for receiving a trigger signal.

6. The improved thyristor of claim 5, wherein: said trigger terminal is connected to said common terminal.

* * * * *